United States Patent [19]

Gillig

[11] Patent Number: 5,065,408
[45] Date of Patent: Nov. 12, 1991

[54] FRACTIONAL-DIVISION SYNTHESIZER FOR A VOICE/DATA COMMUNICATIONS SYSTEMS

[75] Inventor: Steven F. Gillig, Roselle, Ill.

[73] Assignee: Motorola, Inc., Schaumburg, Ill.

[21] Appl. No.: 515,000

[22] Filed: Apr. 26, 1990

[51] Int. Cl.⁵ .............................................. H04B 1/40
[52] U.S. Cl. ....................................... 375/8; 331/1 A; 455/76; 455/87
[58] Field of Search ...................... 375/8, 9, 62, 65, 97, 375/7; 328/14; 364/721, 851; 455/76, 183, 259, 260, 86, 87; 331/1 R, 1 A, 17, 179; 332/100, 101, 103

[56] References Cited

U.S. PATENT DOCUMENTS

| | | | |
|---|---|---|---|
| 4,031,330 | 6/1977 | van Leeuwen | 370/29 |
| 4,061,980 | 12/1977 | Sato | 455/157 |
| 4,204,174 | 5/1980 | King | 331/10 |
| 4,317,221 | 2/1982 | Toya | 455/76 |
| 4,458,214 | 7/1984 | Lakomy | 331/1 A |
| 4,549,302 | 10/1985 | Heatherington | 375/8 |
| 4,567,603 | 1/1986 | Howell et al. | 375/65 |
| 4,648,060 | 3/1987 | Allen et al. | 364/851 |
| 4,758,802 | 7/1988 | Jackson | 331/10 |
| 4,816,774 | 3/1989 | Martin | 331/1 A |

FOREIGN PATENT DOCUMENTS 2091960  6/1985  United Kingdom .

OTHER PUBLICATIONS

Brewerton et al., "Defining the Elements of Good Design", Microwaves and RF, Jun., 1984, pp. 79-86 and 124-125.

Primary Examiner—Benedict V. Safourek
Attorney, Agent, or Firm—Raymond A. Jenski; Rolland R. Hackbart

[57] ABSTRACT

A fractional-division synthesizer for a digital transceiver is disclosed in which the fractional divisor may be separated into an integer, N, and a fraction made up of two integers, [n/d]. The integer n is the numerator of the fraction part of the fractional divisor. The integer N is the whole number portion of the fractional divisor. The integer d multiplied by the value of the transceiver channel spacing is algebraically related to the frequency of the reference oscillator. A bit rate clock is also derived from the reference oscillator.

7 Claims, 2 Drawing Sheets

FRACTIONAL-DIVISION SYNTHESIZER FOR A VOICE/DATA COMMUNICATIONS SYSTEMS

BACKGROUND OF THE INVENTION

This invention relates generally to frequency synthesizers and more particularly to a fractional-division frequency synthesizer which may be employed in radiotelephone communications equipment to generate one of a plurality of signals for use by the radio frequency transceiver.

Phase-locked loop (PLL) frequency synthesis is a well known technique for generating one of many related signals from a voltage controlled oscillator (VCO). In a single loop PLL, an output signal from the VCO is generally coupled to a programmable frequency divider which divides the frequency of the output signal by a selected integer number to provide a frequency divided signal to a phase detector which compares the phase of the frequency-divided signal to the phase of a reference signal from a fixed frequency oscillator which, often, is selected for stability of frequency over time and environmental changes. Any difference in phase between the frequency divided signal and the reference signal is output from the phase detector, coupled through a loop filter, and applied to the VCO in a manner which causes the output signal from the VCO to change in frequency such that the phase error between the frequency divided signal and the reference signal is minimized.

When the integer number of the divisor is changed, the VCO output signal changes frequency by a discrete increment and, therefore, can be stepped from one output signal frequency to another depending upon the integer number value. Since the programmable divider divides by integers only, the output frequency step size is constrained to be equal to the reference signal frequency. The signal output from the phase detector generally contains signal pulses which could produce a substantial amount of noise and spurious signals in addition to the desired VCO output signal. The loop filter integrates the signal output from the phase detector to remove much of the noise and spurious signals but the loop filter integration time slows the process of locking to (or causing the PLL to arrive at) a desired VCO output signal frequency. Thus, with the single loop PLL, an engineering compromise must be struck between the competing requirements of loop lock time, output frequency step size, noise performance, and spurious signal generation.

In order to overcome the limitations of the single loop PLL, programmable frequency dividers capable of dividing by non-integers have been developed. Output frequency step sizes which are fractions of the reference signal frequency are obtained while maintaining a high reference frequency and wide loop bandwidth. A discussion of fractional-division synthesis may be found in U.S. Pat. No. 4,816,774. As described therein, two accumulators are employed to simulate the performance of fractional synthesis of the switching between different integer values of divisors without the attendant spurious signals generated by such switching. The two accumulator technique acts to reduce the unwanted spurious signals both by cancellation and loop filter rejection.

The reference signal frequency for the fractional-division frequency synthesizer is, therefore, determined by the step size of the VCO output frequency multiplied by the non-integer value of the programmable divider divisor. The designer of radiotelephone communication equipment is always faced with the requirement to reduce size, complexity, and cost of the radiotelephone equipment. If the radiotelephone equipment employs digital transmission techniques, the digital equipment conventionally employs a reference signal oscillator to generate the clock for the digital equipment. This clock oscillator may become a source of additional spurious signal output in the VCO output signal and is an added element of cost and complexity.

SUMMARY OF THE INVENTION

Accordingly, it is one object of the present invention to generate one of a plurality of signals to be used by a radio transceiver by using the output signal of a synthesizer divided by a non-integer divisor to create the frequency feedback signal for a PLL.

It is another object of the present invention to produce the non-integer portion of the frequency divider divisor as a ratio of an integer to the integer value of the channel spacing.

It is another object of the present invention to create the digital transmitter bit clock by dividing the signal reference for the synthesizer.

These and other objects are accomplished in the present invention which encompasses a fractional-division synthesizer for a digital radio transceiver. The fractional division synthesizer provides an output signal frequency having a non-integer relationship to a reference signal frequency. A programmable frequency divider divides by a non-integer divisor having a value of the sum of an integer, N, and a fraction determined by the ratio of integers [n/d]. An output signal is generated having a first frequency for a first value of integer n and a second frequency for the next higher integer value of n. A first reference signal is employed to produce a second reference signal with a frequency integerly related to the product of d times the difference of the first frequency of the output signal and the second frequency of the output signal. A third reference signal is produced from the first reference signal and has a frequency algebraically related to the frequency of the first reference signal.

DETAILED DESCRIPTION OF THE PREFERRED EMBODIMENT

Figure 1:
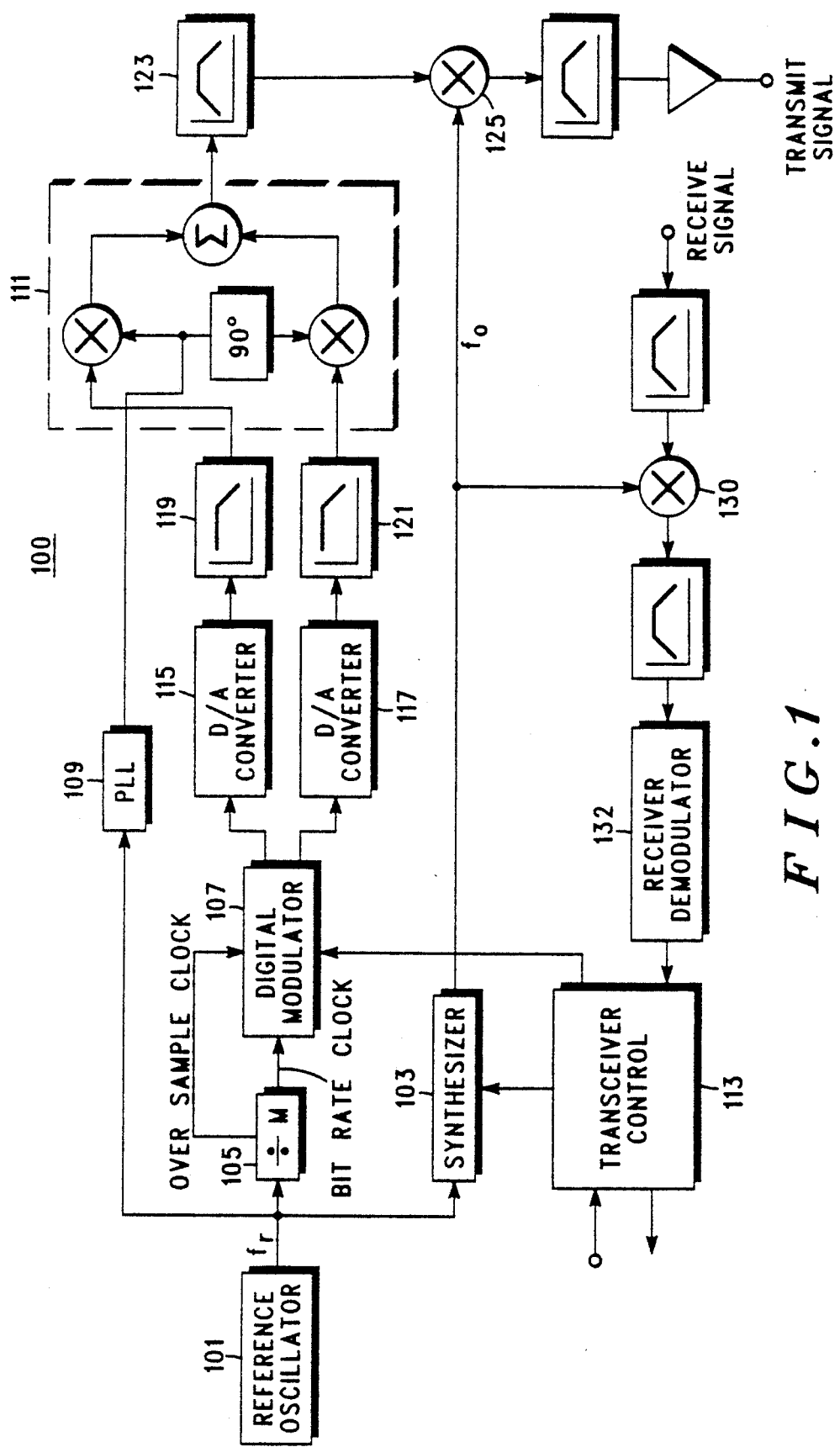
FIG. 1 is a block diagram of a digital transceiver which may employ the present invention.

A radio transceiver employing the present invention is shown in the block diagram of FIG. 1. In the preferred embodiment, the transceiver is a digital cellular transceiver which derives both the high stability frequency reference for the transceiver frequency synthesizer and the frequency reference for the bit rate clock of the logic unit of the transceiver.

A transceiver 100 which employs the present invention is shown in the block diagram of FIG. 1. A reference oscillator 101 provides a reference signal, $f_r$, which remains relatively constant in frequency over time and extremes of environment. Reference signal $f_r$ is applied to frequency synthesizer 103, a conventional frequency divider 105 which has a division of integer value M (and, in the preferred embodiment, has an intermediate integer divisor which is small than M to provide an oversample clock to the digital modulator 107), and to a tracking phase locked loop (PLL) 109 to provide a transmitter local oscillator input to a quadrature mixer 111.

A data signal to be transmitted by the transceiver of FIG. 1 is applied from the data signal generator (not shown) to the transceiver control function 113 where it is processed before being applied to digital modulator 107. Digital modulator 107 provides a quadrature output signal to conventional digital-to-analog converters (DAC) 115 and 117, which are coupled to low pass filters 119 and 121, respectively, before being combined by quadrature mixer 111. The output from quadrature mixer 111 is bandpass filtered by filter 123 and applied to mixer 125 before being filtered and amplified for transmission on a selected radio channel.

Radio channel selection is accomplished by the transceiver control function 113 which, in the preferred embodiment, is instructed via the receiver of the transceiver to select a channel predetermined by a fixed site controller (not shown). The radio channel selection is coupled to the synthesizer 103 for generation of an output frequency $f_o$ which, when mixed with the modulated transmitter local oscillator frequency, produces a radio frequency signal modulated with quadrature data on the predetermined radio channel. The synthesizer output signal of frequency $f_o$ is also applied to receiver mixer 130 where a signal received from the receive frequency of the radio channel is converted to an intermediate frequency suitable for application to receiver demodulator 132. A demodulated receive signal is subsequently applied to transceiver control function 113 for processing before being output to a data signal acceptor (not shown).

In the preferred embodiment, two parameters of the data communication system of the transceiver, bit rate and channel spacing, are chosen as part of the system design to meet certain performance characteristics. The hardware to implement these parameters employs a frequency synthesizer 103 locked to the reference oscillator 101 for the purpose of generating a band of frequencies separated by the channel spacing. When the same reference oscillator is used to produce the data bit rate by means of frequency division, there exists a special requirement for a mathematical relationship between the reference oscillator frequency, the data bit rate, and the channel spacing. Specifically, the reference oscillator must be a multiple of both the data bit rate and channel spacing. When a fractional-division synthesizer is employed, two other related parameters, the fractionalization and the phase detector reference frequency must be related to the reference oscillator frequency, the data bit rate, and the channel spacing.

Figure 2:
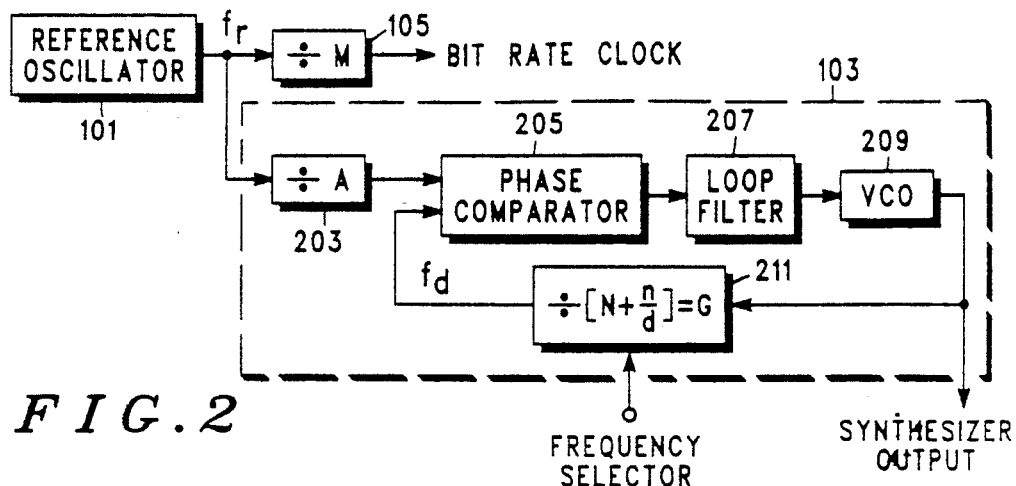
FIG. 2 is a general block diagram of the synthesizer employed in the transceiver of FIG. 1.

As shown in the block diagram of FIG. 2, the frequency synthesizer 103 comprises a frequency divider 203 having a divisor of integer value R which conventionally divides the frequency output $f_r$ from reference oscillator 101 and applies the resulting quotient to conventional phase comparator 205. The output of phase comparator 205 is filtered and integrated by a loop filter 207 and applied as a correction voltage to voltage controlled oscillator (VCO) 209 to produce an output frequency, $f_o$, which is phase-locked to $f_r$. The VCO output frequency, $f_o$, is coupled to the transceiver 100 and to the synthesizer loop divider 211. Loop divider 211 divides by a fractional number, G, which can be conceptualized as an integer, N, added to a fraction, [n/d] In the preferred embodiment, this fractional-division is accomplished in a manner similar to that described in U.S. Pat. No. 4,816,774. However, fractional-division may also be accomplished by, for example, implementations which use more than two accumulators or digital means of generating a waveform to cancel the spurs created by the basic fractional-division process. Since in a fractional division frequency synthesizer, the desired output frequency $f_o$ is not obtained utilizing a single divisor for the programmable divider 211, it is necessary to periodically adjust the value F in a manner such that the average output frequency is equal to the desired output frequency. The divider control circuit is designed to enable the programmable divider 211 to realize the appropriate value of G.

Figure 3:
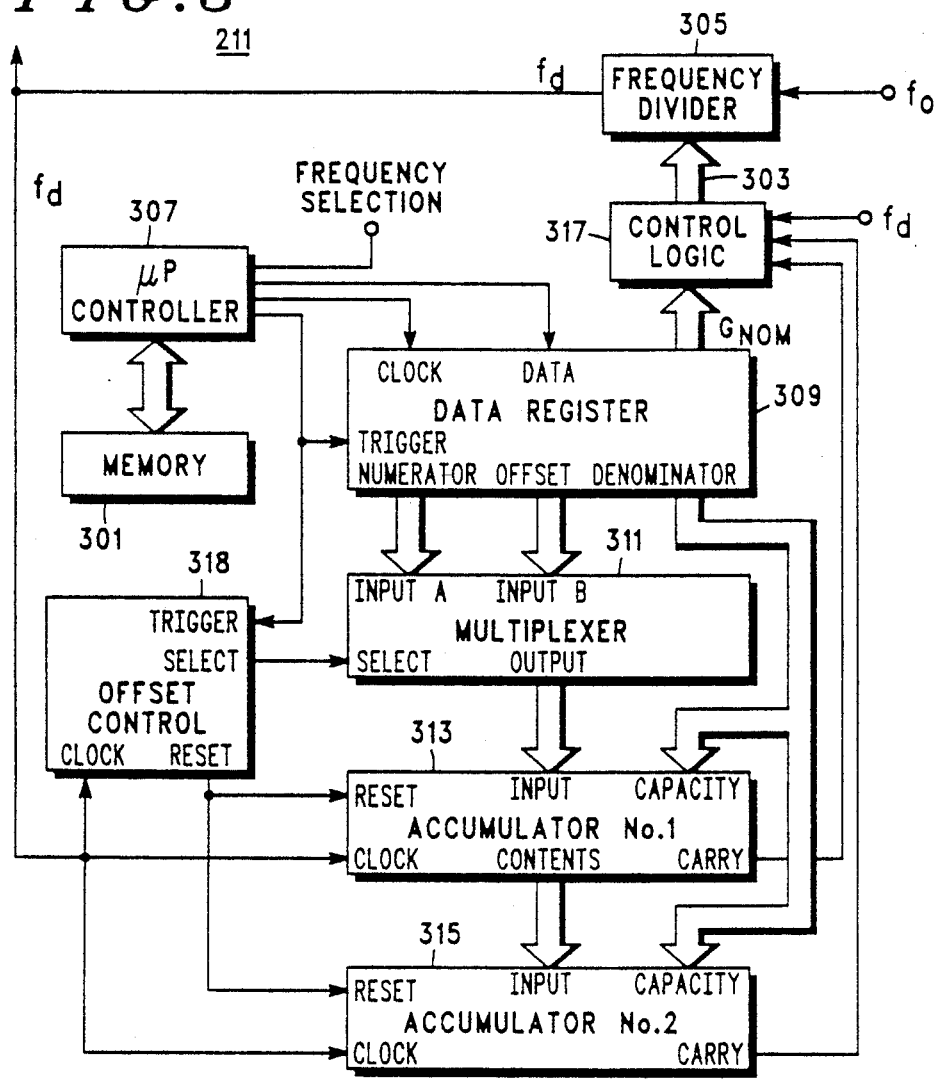
FIG. 3 is a detailed block diagram of a fractional-division synthesizer employed in the synthesizer of FIG. 2.

The programmable divider with its divisor control is shown in more detail in FIG. 3. A memory 301, which can include a programmable read only memory as well as ROM and RAM, is utilized to contain data for use by the divider control circuit for obtaining the signal to be applied via bus 303 to enable divider 305 to divide by G. A microprocessor controller 307 is used to read the data from the memory 301 and supplies the data to a data register 309 which serves also as a latch. Frequency selection is entered from the transceiver control function 113 of the transceiver to the microprocessor controller 307 to choose the synthesizer output signal frequency, $f_o$. The data register 309 provides the various data outputs which have been labeled as numerator, n, the denominator, d, and $G_{nom}$ which is the nominal value for the G divide value. The numerator and offset data lines are connected to A and B inputs respectively of a conventional multiplexer 311. Output data lines of multiplexer 311 are connected to the input of a conventional first accumulator 313. Its output, which is labeled "contents" is connected to the input of a conventional second accumulator 315. Each of the accumulators 313 and 315 has a capacity input connected to the denominator output of data register 309. Carry outputs are provided from both accumulators 313 and 315 and are connected to two inputs of a control logic circuit circuit 317. The output of control logic circuit 317 is connected to the divider 305. The $G_{nom}$ data line of data register 309 is also connected to the control logic circuit 317. The microprocessor controller 307 provides an output that is applied to the trigger inputs of data register 309 and an offset control circuit 318. The offset control circuit 318 has a select output that is connected to a select input of multiplexer 311 and a reset output that is connected to reset inputs of the accumulators 313 and 315. Clock inputs of offset control circuit 318 control logic 317, and accumulators 313 and 315 are provided with the frequency $f_d$ output of divider 305. The basic function of offset control circuit 318 is to reset the accumulators, cause the offset value of the numerator to be input to the first accumulator for one cycle of the clock, and the true numerator value to be input on succeeding cycles of the clock, and is described more fully in aforementioned U.S. Pat. No. 4,816,774 assigned to the assignee of the present invention. Likewise, the logic control 317 performs the function of combining the integer part of the frequency selection data, $G_{nom}$, with the accumulator outputs at times determined by $f_d$ and is also described in U.S. Pat. No. 4,816,774.

The divider control circuit of the preferred embodiment utilizes a multiplexer and offset control to introduce an offset value in accumulators, for improved fractional division synthesis. Various other circuit implementations could be utilized to obtain this desired control of the divider including implementing the accumulators in a microprocessor.

The capacity of the accumulators 313 and 315 is a variable. Capacity information is stored with the other frequency information in the memory 301. The stored value of capacity equals the denominator, d, the 2's complement of which is ultimately applied to the capacity inputs of accumulators 313 and 315. The value of d is derived from the equation $d = f_r/$channel spacing employed by the transceiver.

The input to accumulator 313 and hence, the relationship between the two accumulators 313 and 315, is determined by which of two input words latched in the data register 309 is selected by the offset control 318 as the output of multiplexer 311 to be fed into the input of the first accumulator 313. The two input words are the numerator n for steady state conditions and the offset value which provides a predetermined starting value for the accumulators. The offset value for each desired frequency $f_o$ is stored in a table in memory 301 along with the other frequency information, namely numerator, denominator and $G_{nom}$ values which are loaded into data register 309. The offset value varies with n, d, and the required application.

When a new output frequency, $f_o$, is required, an input is coupled to microprocessor controller 307 via the frequency selection input. The microprocessor controller 307 reads the data from memory 301 for the selected frequency, and causes the data to be clocked into data register 309. The microprocessor controller 307 triggers the data register and offset control to cause the offset value to be applied to the first and second accumulators 313 and 315. The multiplexer 311 is then switched to provide the numerator value, n, to the input of accumulator 313 where it is summed with the previously loaded offset value. For each clock pulse from the $f_d$ signal, the numerator value, n, is again summed with the contents of accumulator 313. Similarly, the output of accumulator 313 is summed in accumulator 315.

The first accumulator 313 has a capacity of d as does the second accumulator 315. For each clock cycle, an input is added to the contents of the first accumulator 313. Contents from the first accumulator 313 are added to the contents of the second accumulator 315. For each clock cycle the accumulator capacity d is reached, that particular accumulator overflows and a carry value of one is generated. Otherwise, a carry value of zero is generated.

For each reference clock cycle $f_d$, the control logic 317 generates an instantaneous divisor output G to the frequency divider 305 based on the inputs to the control logic from the radio memory register's programmed G value, the two instantaneous (i) carry outputs from the first and second accumulators, $C_{1i}$, $C_{2i}$, respectively and the previously stored carry output of the second accumulator $C_{2(i-1)}$ where $G = G_{nom} + C_{1i} + C_{2i} - C_{2(i-1)}$. The net effect over d cycles of the reference clock is that n carry pulses are produced by the first accumulator 313. Accumulator 315 has no effect on the average value of G since the counts are always added and subtracted in pairs by the second accumulator 315. The average value of the programmable divisor then has a whole part equal to the programmed value G and a fractional part equal to n/d. In this way, a non-integer value for the loop divider is created to obtain the desired output frequency $f_o$ from the multiplication of the reference frequency fr by the non-integer loop divider where $f_o = f_r(N + [n/d])$.

In the preferred embodiment, the transceiver must operate at discrete (but changeable) radio frequencies. The minimum frequency spacing between adjacent radio frequencies is known as the channel spacing, here: "C". The bit rate of the data communication which is conveyed to and/or from the transceiver is determined by the system designer and is labeled herein as "B". Accordingly, the designer of the transceiver is presented with C and B already defined. The relationship which must hold is:

$$C \cdot d \cdot R = f_r = M \cdot b$$

where,

R = the division of ratio of the reference divider 203
M = the division ratio between the reference oscillator 101 and the bit rate clock In an alternative embodiment, M may be a fractional number due to the use of a rate multiplier to produce the bit rate clock without affecting the correctness of the relationship.

The transceiver designer must design the equipment with the parameters fr, M, R, and d in accordance with this relationship. Furthermore, d is to be an odd number since the 2-accumulator fractional-division approach with an even d produces undesirable spurious frequency responses at half multiples of the channel spacing, C, while an odd d only produces undesirable spurious frequency responses at multiples of the channel spacing. A spurious response at a first amplitude level with respect to the amplitude level of the $f_o$ frequency implies less residual phase modulation than two spurious responses at the first amplitude with respect to the carrier. This is important in a data communication system requiring extremely good phase accuracy.

Also, d is designed to be >10, so that the improvement in phase noise within the bandwidth of the loop filter of the PLL is >20 dB for a well designed loop in which the reference oscillator side band noise (noise in a band of frequencies surrounding the reference oscillator frequency) is better than the VCO sideband noise within the loop bandwidth. A d>10 also provides enough options for the 2-accumulator offset technique so that the spurious signal response pattern can be manipulated to fit the shape of the transmitter spurious response specification. The phase detector reference frequency will be:

$$[f_r/R] = d \cdot C$$

from the previous relationship. A d>10 puts the phase detector reference spurious frequency response at >10 times the frequency of the integer-division loop so that the loop filter attenuation and the frequency modulation sensitivity (beta) reduction both contribute to reduced spurious responses for a comparable loop bandwidth. This is important because wide loop bandwidths are required for fast frequency-hopping synthesizers such as often necessary for TDMA voice-data communication systems.

I claim:

1. A fractional-division synthesizer for a digital radio transceiver, the synthesizer providing an output signal having a non-integer frequency relationship to a reference signal frequency, the fractional-division synthesizer comprising:
- a phase comparator having at least a first input and at least a first output;
- a programmable frequency divider with a non-integer divisor having a value of the sum of an integer,N, and a fraction determined by the ratio of integer, {n/d}, said programmable frequency divider having at least a first input and at least a first output, said first output of said programmable frequency divider coupled to said first input of said frequency comparator, said programmable frequency divider dividing the frequency of said output signal;
- means for generating an output signal having a first frequency when said non-integer divisor has a first value determined by a first integer value of n and for generating an output signal having a second frequency when said non-integer divisor has a second value determined by the next larger integer value of n, an input of said means for generating coupled to said first output of said phase comparator, an output of said means for generating an output signal coupled to said first input of said programmable frequency divider;
- means for generating a first reference signal;
- means, responsive to said means for generating a first reference signal, for producing a second reference signal coupled to a second input of said phase comparator, said second reference signal having a frequency integerly related to the product of d times the difference of said first output signal frequency and said second output signal frequency; and
- means, responsive to said means for generating a first reference signal, for producing a third reference signal coupled to a digital portion of said digital transceiver, said third reference signal having a frequency algebraically related to said first reference signal frequency.

2. A fractional-division synthesizer in accordance with claim 1 wherein said means for producing said second reference signal further comprises a frequency divider coupled to said phase comparator and having an integer divisor value.

3. A fractional-division synthesizer in accordance with claim 1 wherein said third reference signal frequency is algebraically related to said second reference signal frequency by an integer value.

4. A method of frequency synthesis for a digital radio transceiver employing a fractional-division synthesizer, the synthesizer providing at least one output signal with a frequency having a non-integer frequency relationship to a reference signal frequency, comprising the steps of:
- programmably frequency dividing the output signal of the synthesizer with a non-integer divisor having a value of the sum of an integer,N, and a fraction determined by the ratio of integers {n/d};
- generating an output signal having a first frequency when said non-integer divisor has a first value determined by a first integer value of n and generating an output signal having a second frequency when said non-integer divisor has a second value determined by the next larger integer value of n;
- generating a first reference signal;
- producing, in response to said generating a first reference signal step, a second reference signal, said second reference signal having a frequency integrally related to the product of d times the difference in frequency of said first and second output signals, and utilized in said step of generating said output signal; and
- producing, in response to said generating a first reference signal step, a third reference signal coupled to a digital portion of said digital transceiver, said third reference signal frequency being algebraically related to the frequency of said first reference signal.

5. A digital radio transceiver employing a fractional-division synthesizer, the synthesizer providing a synthesizer output signal having a non-integer frequency relationship to a reference signal frequency, the digital radio transceiver comprising:
- a digital transmitter employing a digital modulator responsive to a clock signal;
- a phase comparator having at least a first input and a first output;
- a programmable frequency divider with a non-integer divisor having a value of the sum of an integer,N, and a fraction determined by the ratio of integers {n/d}, said programmable frequency divider having at least a first input and at least a first output, said first output of said programmable frequency divider coupled to said first input of said phase comparator;
- means for generating a synthersizer output signal having a first frequency when said non-integer divisor has a first value determined by a first integer value of n and for generating a synthesizer output signal having a second frequency when said non-integer divisor has a second value determined by the next larger integer value of n, an output of said means for generating coupled to a first input of said programmable frequency divider;
- means for generating a first reference signal;
- means, responsive to said means for generating a first reference signal, for producing a second reference signal coupled to a second input of said phase comparator, said second reference signal having a frequency integrally related to the product of d times the difference of said first output signal frequency and said second output signal frequency; and
- means, responsive to said means for generating a first reference frequency, for producing said clock signal coupled to said digital modulator, said clock signal having a frequency algebraically related to said first reference signal frequency.

6. A digital radio transceiver in accordance with claim 5 wherein said means for producing said second reference signal further comprises a frequency divider coupled to said phase comparator and having an integer divisor value.

7. A digital radio transceiver in accordance with claim 5 wherein said clock signal frequency is algebraically related to said second reference signal frequency by an integer value.

* * * * *